(12) United States Patent  
Chowdhury

(10) Patent No.: US 7,187,319 B1
(45) Date of Patent: Mar. 6, 2007

(54) BULK-COMPENSATED SAMPLING NETWORK FOR WIDE RANGE OF SIGNALS

(75) Inventor: Golam R. Chowdhury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/238,931

(22) Filed: Sep. 29, 2005

(51) Int. Cl.
 *H03M 1/34* (2006.01)
(52) U.S. Cl. ...................................... 341/163; 341/161
(58) Field of Classification Search ................ 341/118, 341/120, 156, 158, 161, 162, 163
See application file for complete search history.

(56) References Cited

U.S. PATENT DOCUMENTS 5,247,299 A * 9/1993 Lim et al. .................... 341/136
6,486,806 B1 * 11/2002 Munoz et al. .............. 341/120
7,015,841 B2 * 3/2006 Yoshida et al. ............. 341/120

* cited by examiner

*Primary Examiner*—Brian Young
(74) *Attorney, Agent, or Firm*—Howison & Arnott, L.L.P.

(57) ABSTRACT

A sampling network comprises analog comparator for comparing an analog voltage to a plurality of successive voltage inputs. A plurality of capacitors are connected in parallel with a first end of each of the capacitors coupled to the first input of the analog comparator to provide one of the successive voltage inputs. A first plurality of switches includes one switch associated with each of the plurality of capacitors to connect an input voltage to the second end of the capacitor. A bulk of a switch of the first plurality of switches is connected to the input voltage while the input voltage is being sampled and to a power supply voltage while the reference voltage is being sampled. A second plurality of switches is in parallel with the first plurality of switches and further includes one switch connected to each of the plurality of capacitors. The second plurality of switches connect a reference voltage to a second end of the capacitor. A bulk of a switch of the second plurality of switches is connected to the reference voltage while the reference voltage is being sampled and to the power supply voltage while the input voltage is being sampled.

18 Claims, 4 Drawing Sheets

BULK-COMPENSATED SAMPLING NETWORK FOR WIDE RANGE OF SIGNALS

TECHNICAL FIELD OF THE INVENTION

The present invention relates to sampling networks, and more particularly, to bulk compensated sampling networks for a wide range of signals.

BACKGROUND OF THE INVENTION

A successive approximation register comprises an analog-to-digital conversion method in which the input voltage is compared with the output voltage of a sequentially programmed digital-to-analog converter. First, the most significant bit (msb) of the digital-to-analog converter is turned on and compared with an analog input. If the input is greater than the digital-to-analog output, the msb is left on. Otherwise, it is turned off. This process is repeated for all other bits in decreasing order until the least significant bit (lsb) is reached. Within sampling circuits, such as a successive approximation register operating over a wide range of voltages such as from 0–3.6 V, there are signal ranges wherein the CMOS switches used within the sampling circuits may become nonconductive and show a very high resistance due to the bulk effect. This can increase the threshold voltage, $V_t$, of the transistor, which increases with the bulk-to-source voltage, $V_{BS}$. The occurrence of the bulk effect within the CMOS devices is highly undesirable since the sampling circuits are supposed to operate most effectively when the switches are conductive throughout the entire operational voltage range. Thus, some manner for reducing or removing the bulk effect of the CMOS switches during sampling to increase the operating voltage range of the analog-to-digital converter would be greatly beneficial.

SUMMARY OF THE INVENTION

The present invention disclosed and claimed herein, in one aspect thereof, comprises a sampling network. The sampling network includes an analog comparator for comparing an analog voltage to a plurality of successive voltage inputs. The plurality of capacitors are connected in parallel having a first end of each of the capacitors coupled to a first input of the analog comparator to provide one of the successive voltage inputs. The second end of the capacitors are connected to a first and second plurality of switches. The first plurality of switches connects an input voltage to the second end of the capacitor. The bulk of the first plurality of switches is connected to the input voltage while the input voltage is being sampled and to a power supply voltage while the reference voltage is being sampled. The second plurality of switches is in parallel with the first plurality of switches and connects a reference voltage to a second end of the capacitor. The bulk of the second plurality of switches is connected to the reference voltage while the reference voltage is being sampled and to a power supply voltage while the input voltage is being sampled.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
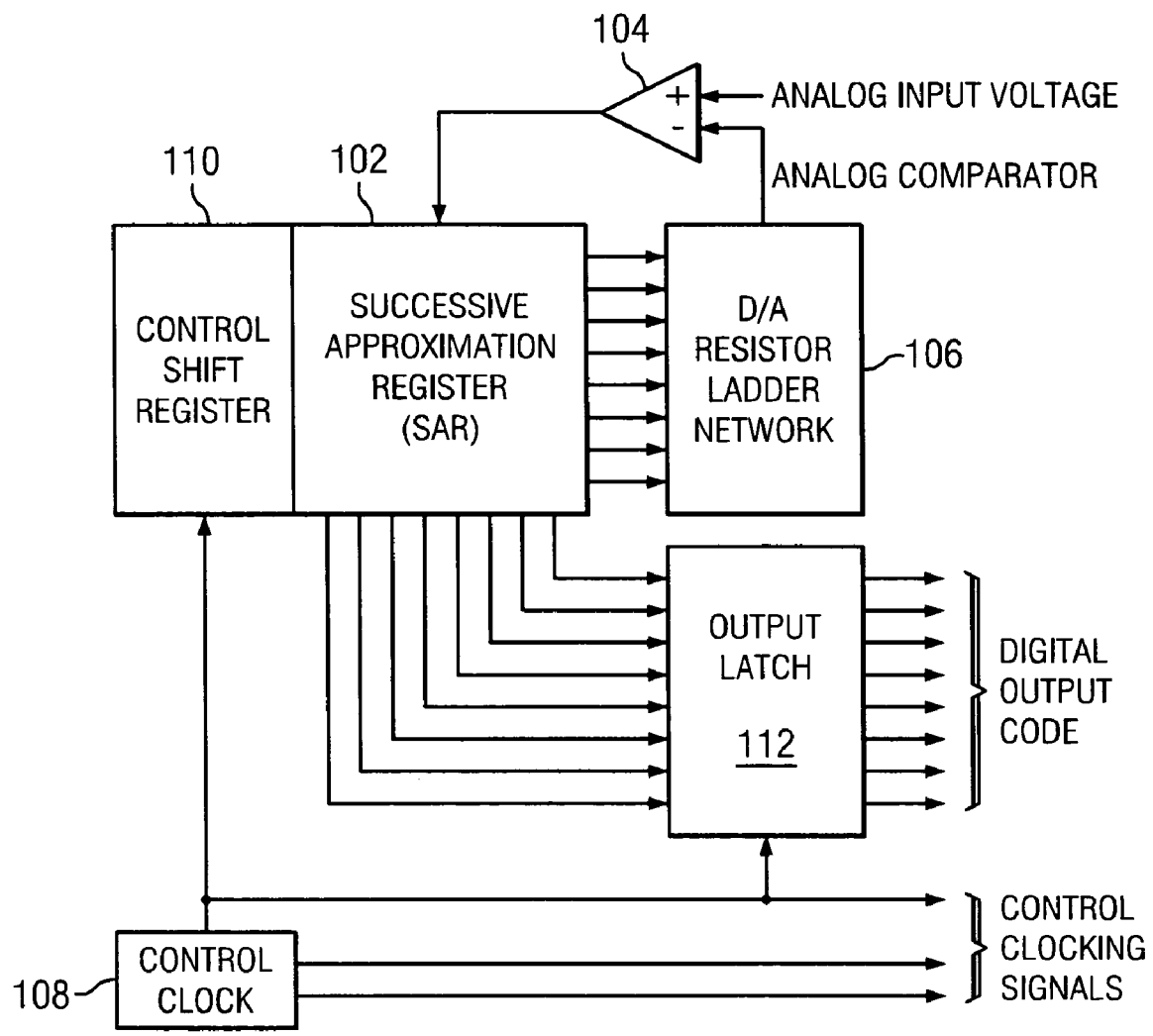
FIG. 1 is a functional block diagram of a successive approximation A/D converter.

Referring now to the drawings, and more particularly to FIG. 1, wherein there is illustrated a functional block diagram of a successive approximation A/D converter. Successive approximation A/D conversion is a technique that is commonly used in medium to high speed data acquisition applications. The successive approximation A/D conversion is one of the fastest A/D conversion techniques that requires a minimum amount of circuitry.

The successive approximation A/D converter can approximate the analog-to-digital signal to form an n-bit digital code in n-steps. The successive approximation register 102 individually compares an analog input voltage to the mid-point of one of n ranges to determine the value of one bit. This process is repeated a total of n times, using n ranges, to determine the n-bits of the code. The comparison is accomplished as follows. The SAR 102 determines if the analog input is above or below the mid-point and sets the bit of the digital code accordingly. The SAR 102 assigns the bits beginning with the most significant bit. The bit is set to "1" if the analog input is greater than the mid-point voltage, or it is set to a "0" if it is less than the mid-point voltage. The SAR 102 then moves to the next bit and sets it at a "1" or a "0" based on the results of comparing the analog input with a mid-point of the next allowed range. Because the SAR must perform one approximation for each bit in the digital code, an n-bit code requires n approximations.

The successive approximation A/D converter as illustrated in FIG. 1 consists of four functional blocks, the SAR 102, the analog comparator 104, a D/A converter 106 and a clock 108. Rotation through the n-bit approximation is controlled by the control shift register 110. The output latch 112 latches in the bits of the digital output code as they are determined by the SAR 102. The analog comparator 104 performs the comparisons of an analog input voltage with the mid-point of the selected one of n-ranges presently being examined.

Figure 2:
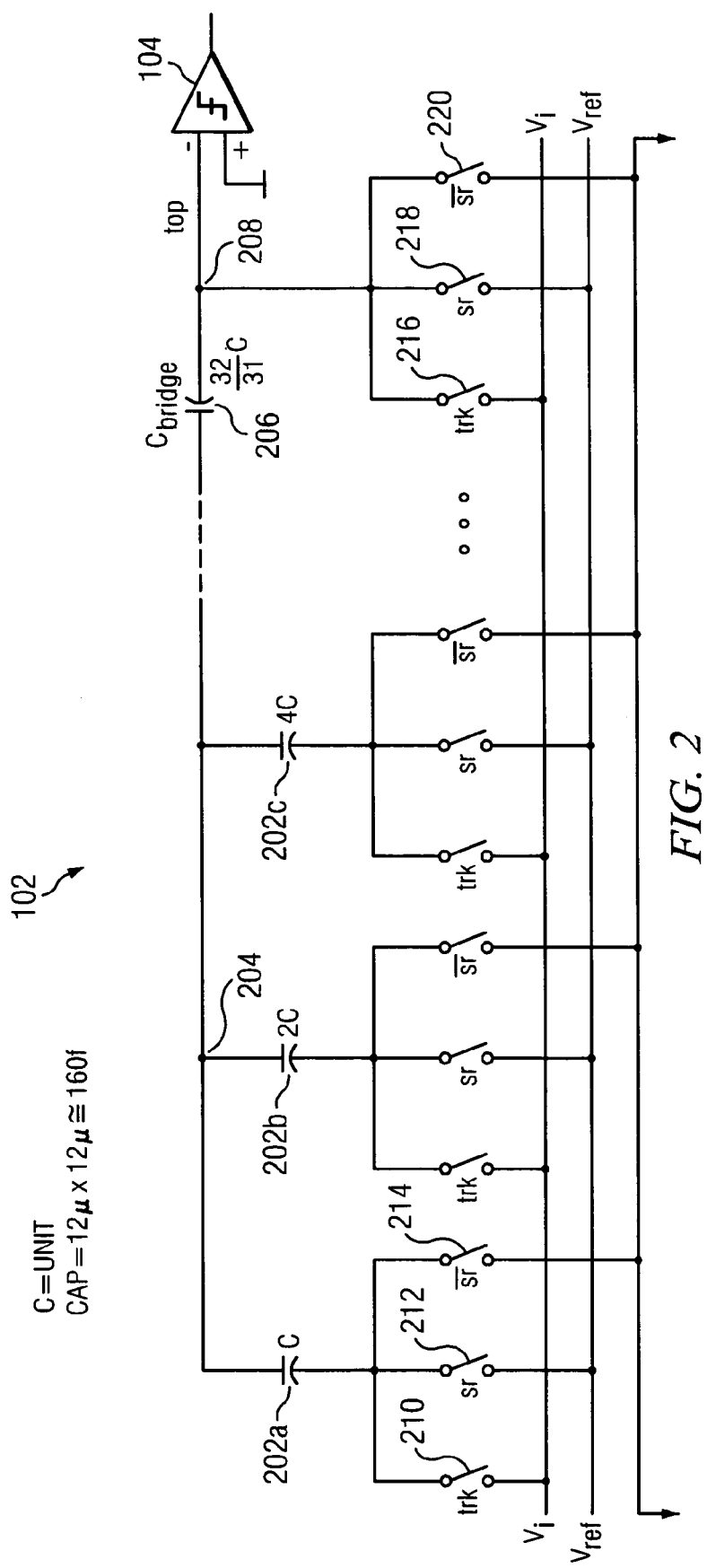
FIG. 2 is a schematic diagram of a basic successive approximation register (SAR) architecture.

Referring now to FIG. 2, there is illustrated the basic architecture of the successive approximation register (SAR) 102. The SAR 102 consists of a group of capacitors 202 connected in parallel wherein first plates of each of the capacitors are interconnected at a common node 204. The capacitors 202 are binary weighted capacitors that progressively double in their capacitance value such that a capacitor 202a representing the least significant bit has a capacitance of C, a capacitor 202b has a capacitance of 2C and a capacitor 202C has a capacitance of 4C. A capacitor bridge 206 interconnects node 204 with node 208 that is connected to a negative input of analog comparator 104. The capacitors to the right side of the bridge capacitor 204 are connected to node 208. The opposite plates of capacitors 202 are selectively connected to either of an input voltage $V_i$ through a switch 210, a reference voltage $V_{REF}$ through switch 212 or ground through the switch 214.

Figure 3:
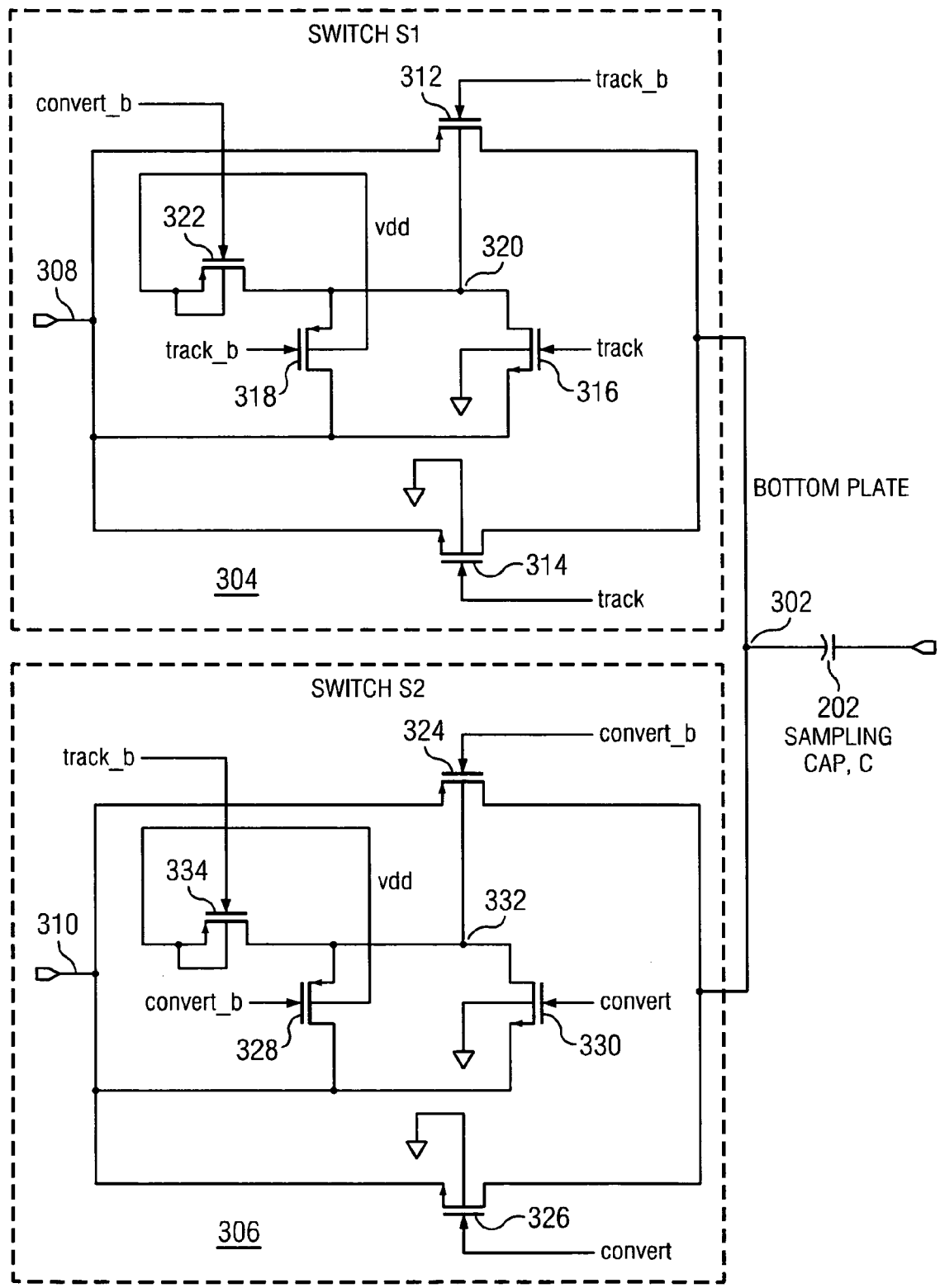
FIG. 3 is a schematic diagram of the switches used for the tracking and conversion modes of the SAR.

Referring now to FIG. 3, there is illustrated a schematic diagram of the switches 210 and 212 or 216 and 218 within the SAR 102. For sampling circuits with a wide range of signals there are signal ranges wherein the CMOS switches within the circuit become nonconductive and have very high resistances due to the bulk effect in the presence of some voltages. This is due to the fact that the threshold voltage $V_t$ of the transistors is a function of the bulk-too-source, $V_{BS}$, voltage. The threshold voltage $V_t$ increases as bulk-to-source voltage $V_{BS}$ increases. $V_{BS}$ for a p-channel transistor may not be "0" volts, as the n-well in which the p-channel transistor is typically connected to the power supply voltage $V_{DD}$, where $V_{DD}$ is the highest voltage of the circuit. This is done to prevent forward biasing of the bulk PN diode between the n-well and p-subst4rate and also between the n-well and p-diffusion of of the source or drain. As will be described hereinbelow, the n-well is dynamically switched between $V_{DD}$ and the source. The switching circuit illustrated in FIG. 3 utilizes this dynamic switching to remove the bulk effect during sampling, enabling the switches to remain conductive over the entire range of voltage levels. This configuration also has the additional advantage of reducing the switch sizes from switches not eliminating the bulk effect.

The capacitor 202 comprises the sampling capacitor and has one plate connected to the analog comparator 104 and a second plate connected to an output node 302. The output node 302 is also connected to the outputs of a first switch 304 and a second switch 306. The input 308 of switch 304 is connected to the input voltage $V_i$. The input 310 of switch 306 is connected to the reference voltage $V_{REF}$. Switch 304 samples the input voltage $V_i$ during the sampling phase of the analog-to-digital converter. Switch 306 is turned off during the time that switch 304 is sampling. Switch 306 samples the reference voltage $V_{REF}$ during the conversion phase of the analog-to-digital converter. The switch 304 is turned off during the time the analog-to-digital converter is converting.

Switch 304 consists of a p-channel transistor 312 and an n-channel transistor 314. Switch 312 has its source/drain path connected between the input 308 and the output at node 302. Transistor 314 has its drain/source path connected between the input 308 and the output 302. The substrate of n-channel transistor 314 is connected to ground. The bulk of p-channel transistor 312 is connected to another switch consisting of n-channel transistors 316 and p-channel transistor 318. Transistor 316 has its source/drain path connected between node 320 and the input 308. Transistor 318 has its source/drain path connected between node 320 and the input 308. The bulk of transistor 316 is connected to ground. The substrate of transistor 318 is connected to VDD. Transistor 322 has its source/drain path connected between VDD and node 320.

Switch 306 consists of p-channel transistor 324 and n-channel transistor 326. Transistor 324 has its source/drain path connected between the input 310 and the output at node 302. Transistor 326 has its drain/source path connected between the input 310 and the output 302. The substrate of transistor 326 is connected to ground. The bulk of n-channel transistor 324 is connected to another switch consisting of n-channel transistor 330 and p-channel 328. Transistor 328 has its source/drain path connected between node 332 and the input 310. Transistor 330 has its source/drain path connected between node 332 and the input 310. The substrate of transistor 330 is connected to ground. The bulk of transistor 328 is connected to VDD. Transistor 334 has its source/drain path connected between VDD and node 332.

The transistors 312–322 are driven by the track, track_b and convert_b signals. The track_bar signal associated with input sampling operation or "tracking" phase of the SAR converter is connected to the gates of transistors 312 and 318. The track signal associated with input sampling operation or "tracking" phase of the SAR converter is connected to the gates of transistor 316 and transistor 314. The convert_bar signal associated with the "conversion" phase is connected to the gate of transistor 322. The track and track_bar signals turn on and off the switch 304. These signals also turn on and off the switch connected to the bulk of transistor 312 that connects the bulk of p-channel transistor 312 to the input voltage $V_i$ or to VDD. Convert_bar turns on and off transistor 322 that connect the bulk of transistor 312 to VDD. This provides the dynamic switching operation.

The transistors 324–334 are driven by the convert, convert_b and track_b signals. The convert_bar signal is connected to the gate of transistor 324 and 328. The convert signal is connected to the gates of transistors 326 and transistor 330. The track signal is connected to the gate of transistor 334. The convert and convert_bar signals turn on and off the switch 306. These signals also turn on and off the switch connected to the bulk of p-channel transistor 324 that connects the bulk of transistor 324 to the reference voltage $V_{REF}$ or to $V_{DD}$. Track_b turns on and off transistor 334 that connects the bulk of transistor 324 to VDD. This provides the dynamic switching operation.

$V_i$ and $V_{REF}$ are the input and reference voltages of the analog-to-digital converter, respectively. Both $V_i$ and $V_{REF}$ can vary from 0V to the power supply voltage of the circuit, VDD. The power supply voltage VDD can be any voltage from 1.8–3.6V. Thus, $V_i$ and $V_{REF}$ can each vary from 0V to 3.6V. The sampling network has two modes of operation, track mode and convert mode. Switch 304 is turned on by turning on its main switching transistors 312 and 314. Switch 306 is turned on by turning on its main switching transistors 324 and 326. During the track mode, switch 306 remains off while switch 304 is turned on. This causes the bottom plate of the sampling capacitor 202 to charge with the input voltage $V_i$. If the bulk of the p-channel transistor 312 of switch 304 is always tied to the power supply VDD, the switch 304 could become non-conductive and show a very high resistance due to the bulk effect, due to an increasing $V_T$ due to $V_{BS}$ not being equal to "0." When this occurs, the capacitor 202 cannot be charged with the input voltage within the sampling time allowed. To eliminate the bulk effect, the bulk of p-channel transistor 312 is dynamically connected to the source of transistor 312 during the time that the switch 304 is sampling the input voltage $V_i$. This causes the bulk of transistor 312 to be connected to the input voltage $V_i$, forcing its $V_{BS}=0$. The auxiliary switch consisting of transistors 316 and 318 within switch 304 is used for this purpose.

While the input voltage $V_i$ is being sampled, the transistor 322 remains off. At any given time only one of the switches 304 and 306 are sampling, and the bulk of the switch that is not sampling is connected to the power supply voltage VDD during this time to avoid forward biasing the diffusion to the bulk diode. During this time, the source or drain terminal of the off switch can be connected to any voltage between 0V and 3.6V. When switch 304 is on, the source of switch 306 is connected to VDD by turning on the transistor 334 for switch 306. Thus, the bulk of the sampling switch is dynamically connected between the signals being sampled ($V_{IN}$ or $V_{REF}$) and the power supply VDD depending on the operating mode.

Switch 306 is used to sample the reference voltage $V_{REF}$ during the convert mode. During the convert mode, switch 304 remains off while switch 306 is turned on. This causes the bottom plate of the sampling capacitor 202 to charge with the reference voltage $V_{REF}$. If the bulk of the p-channel transistor 324 of switch 306 is always tied to the power supply VDD, the switch 306 could become non-conductive and show a very high resistance due to the bulk effect. When this occurs, the capacitor 202 cannot be charged with the reference voltage $V_{REF}$ within the time allowed. To eliminate the bulk effect, the bulk of p-channel transistor 324 is dynamically connected to the source of transistor 324 during the time that the switch 306 is sampling the reference voltage $V_{REF}$, forcing its $V_{BS}$ to "0." This causes the bulk of transistor 324 to be connected to the reference voltage $V_{REF}$. The auxiliary switch consisting of transistors 328 and 330 within switch 306 are used for this purpose.

While the reference voltage $V_{REF}$ is being sampled, the transistor 334 remains off. At any given time only one of the switches 304 and 306 are sampling, and the bulk of the switch that is not sampling is connected to the power supply voltage VDD during this time to avoid forward biasing the diffusion to the bulk diode. During this time, the source or drain terminal of the off switch can be connected to any voltage between 0V and 3.6V. When switch 306 is on this is achieved by turning on the transistor 322 for switch 304. When switch 306 is turned on, the source of switch 304 is connected to VDD by turning on the transistor 322 for switch 304. Thus, the bulk of the sampling switches are dynamically connected between the signals being sampled ($V_{IN}$ or $V_{REF}$) and the power supply VDD depending on the operating mode.

Figure 4:
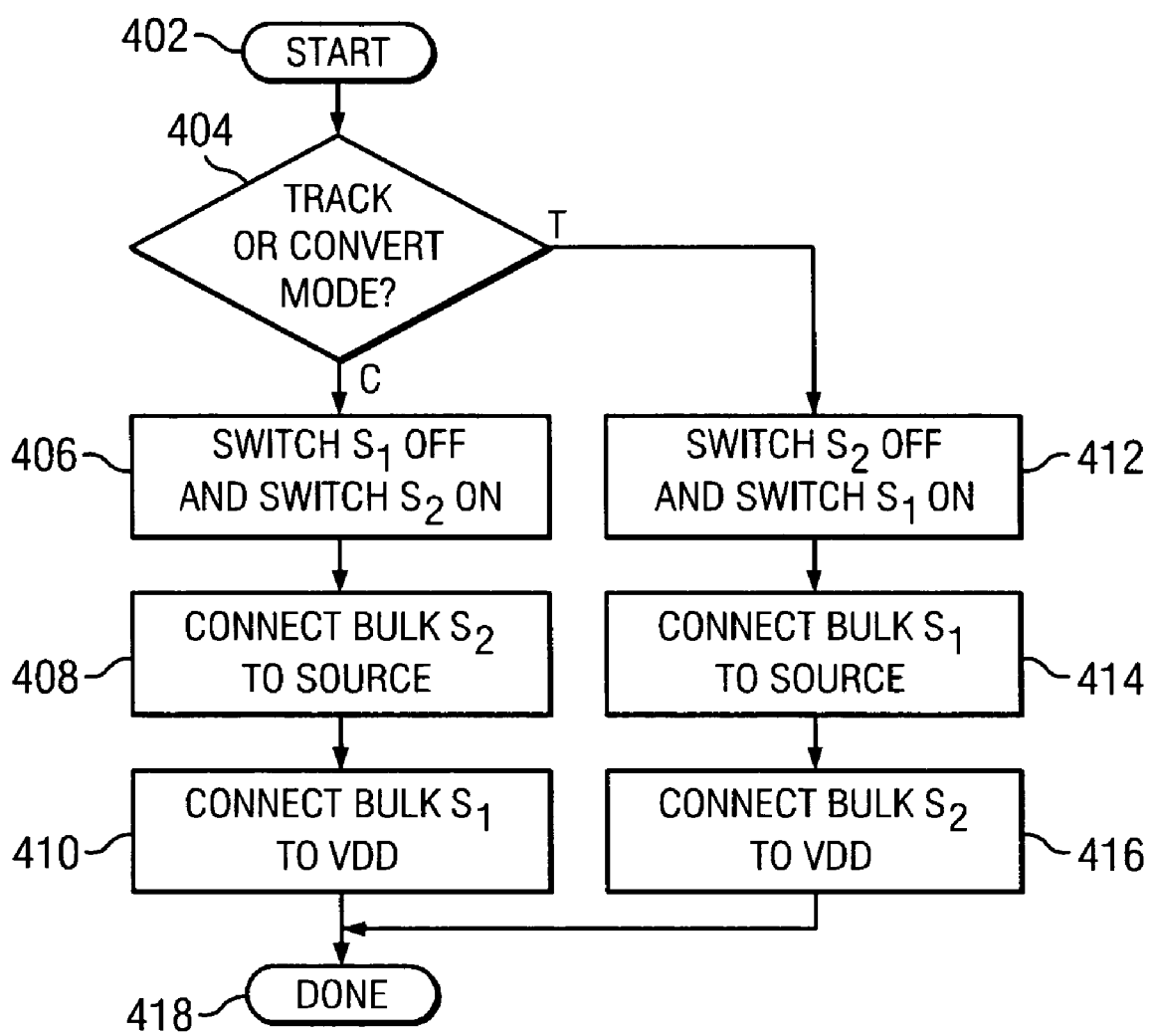
FIG. 4 is a flow diagram illustrating the operation of the SAR.

Referring now to FIG. 4, there is illustrated a flow diagram describing the operation of the switches 304 and 306 within the SAR 102. The process is initiated at step 402, and inquiry step 404 determines whether the SAR 120 is in the track mode or the convert mode. If inquiry step 404 determines that the SAR 102 is in the convert mode, switch 304 is turned off and switch 306 is turned on at step 406. This is accomplished by applying digital high and low signals to the gates of transistors 312 and 314, and digital low and high signals to the gates of transistors 324 and 326 of switch 306. Next, the bulk of transistor 324 is connected to its source (Vref) at step 408 by applying digital high and low signals to the gates of transistors 316 and 318. Additionally, the bulk of transistor 312 is connected to system voltage VDD at step 410.

If inquiry step 404 determines that the SAR 102 is in the track or sampling mode, switch 306 is turned off and switch 304 is turned on at step 412. This is accomplished by applying digital high or low signals to the gates of transistors 324 and 326 and digital low and high signals to the gates of transistors 312 and 314 of switch 304. Next, the bulk of transistor 312 is connected its source ($V_i$) at step 414 by applying digital high and low signals to the gates of transistors 316 and 318. Additionally, the bulk of transistor 334 is connected to system voltage VDD at step 416. The process is completed at step 418.

Although the preferred embodiment has been described in detail, it should be understood that various changes, substitutions and alterations can be made therein without departing from the scope of the invention as defined by the appended claims.

What is claimed is:

1. A sampling network, comprising:
   an analog comparator for comparing an analog input voltage to a plurality of successive voltage inputs;
   a plurality of capacitors connected in parallel, a first end of each of the capacitors coupled to a first input of the analog comparator to provide one of the successive voltage inputs to the first input of the analog comparator;
   a first plurality of switches, one connected to each of the plurality of capacitors, for connecting an input voltage to a second end of the capacitor, wherein a bulk of a switch of the first plurality of switches is connected to the input voltage while the input voltage is being sampled and to a power supply voltage while a reference voltage is being sampled; and
   a second plurality of switches in parallel with the first plurality of switches, one connected to each of the plurality of capacitors, for connecting the reference voltage to a second end of the capacitor, wherein a bulk of a switch of the second plurality of switches is connected to the reference voltage while the reference voltage is being sampled and to a power supply voltage while the input voltage is being sampled.

2. The sampling network of claim 1, wherein each switch of the first plurality of switches further comprises:
   a first transistor pair for selectively connecting the input voltage to a capacitor of the plurality of capacitors; and
   a second transistor pair for selectively connecting the bulk of one transistor of the first transistor pair to the input voltage.

3. The sampling network of claim 1, wherein each switch of the second plurality of switches further comprises:
   a first transistor pair for selectively connecting the reference voltage to a capacitor of the plurality of capacitors; and
   a second transistor pair for selectively connecting the bulk of one transistor of the first transistor pair to the reference voltage and the power supply voltage.

4. The sampling network of claim 1, wherein each switch of the first plurality of switches further comprises a transistor for connecting the bulk of the switch to the power supply voltage while an associated switch of the second plurality of switches is sampling the reference voltage.

5. The sampling network of claim 1, wherein each switch of the second plurality of switches further comprises a transistor for connecting the bulk of the switch to the power supply voltage while an associated switch of the first plurality of switches is sampling the input voltage.

6. The sampling network of claim 1, further including a third plurality of switches in parallel with the second plurality of switched, one connected to each of the plurality of capacitors, for connecting ground to a second end of the capacitor.

7. A successive approximation A/D converter, comprising:
   an analog comparator for comparing an analog input voltage to a plurality of successive voltage inputs;
   a successive approximation register for generation of the successive voltage inputs, the successive approximation register containing a plurality of switches for sampling a reference voltage and an input voltage, wherein a bulk of a selected switch of the plurality of switches is connected between either a reference voltage or the input voltage and a power supply voltage while the input voltage or reference voltage is being sampled;
   a shift control register for rotating the successive approximation register between the successive voltage inputs; and
   an output latch for latching a determined value of a bit from the successive approximation register.

8. The successive approximation A/D converter of claim 7, wherein the successive approximation register further includes:

a plurality of capacitors connected in parallel, a first end of each of the capacitors coupled to a first input of the analog comparator to provide the capacitive voltage to the first input of the analog comparator;

a first plurality of switches, one connected to each of the plurality of capacitors, for connecting an input voltage to a second end of the capacitor, wherein a bulk of a switch of the first plurality of switches is dynamically connected to the input voltage while the input voltage is being sampled and to a power supply voltage while the reference voltage is being sampled; and a second plurality of switches in parallel with the first plurality of switches, one connected to each of the plurality of capacitors, for connecting a reference voltage to a second end of the capacitor, wherein a bulk of a switch of the second plurality of switches is connected to the reference voltage while the reference voltage is being sampled and a power supply voltage while the input voltage is being sampled.

9. The successive approximation A/D converter of claim 8, wherein each switch of the first plurality of switches further comprises:

a first transistor pair for selectively connecting the input voltage to a capacitor of the plurality of capacitors; and a second transistor pair for selectively connecting the bulk of one transistor of the first transistor pair to the input voltage.

10. The successive approximation A/D converter of claim 9, wherein each switch of the second plurality of switches further comprises:

a first transistor pair for selectively connecting the reference voltage to a capacitor of the plurality of capacitors; and a second transistor pair for selectively connecting the bulk of one transistor of the first transistor pair to the reference voltage.

11. The successive approximation A/D converter of claim 10, wherein each switch of the first plurality of switches further comprises a transistor for connecting the bulk of the switch to the power supply voltage while an associated switch of the second plurality of switches is sampling the reference voltage.

12. The successive approximation A/D converter of claim 11, wherein each switch of the second plurality of switches further comprises a transistor for connecting the bulk of the switch to the power supply voltage while an associated switch of the first plurality of switches is sampling the input voltage.

13. The sampling network of claim 12, further including a third plurality of switches in parallel with the second plurality of switched, one connected to each of the plurality of capacitors, for connecting ground to a second end of the capacitor.

14. A method for sampling an analog signal, comprising the steps of:

determining whether a successive approximation register is in a track or a convert mode;

if the successive approximation register is in the track mode, turning on a first switch and turning off a second switch to enable sampling of an input voltage signal;

connecting a bulk of the first switch to the input voltage signal;

if the successive approximation register is in the convert mode, turning on the second switch and turning off the first switch to enable sampling of a reference voltage signal; and connecting a bulk of the second switch to the reference voltage signal.

15. The method of claim 14, further including the step of connecting a bulk of the second switch to system power if the successive approximation register is in the track mode.

16. The method of claim 14, further including the step of connecting a bulk of the first switch to system power if the successive approximation register is in the convert mode.

17. A sampling network, comprising:

an analog comparator for comparing an analog input voltage to a plurality of successive voltage inputs;

a plurality of capacitors connected in parallel, a first end of each of the capacitors coupled to a first input of the analog comparator to provide one of the successive voltage inputs to the first input of the analog comparator;

a first plurality of switches, one connected to each of the plurality of capacitors, for connecting an input voltage to a second end of the capacitor, wherein a bulk of a switch of the first plurality of switches is connected to the input voltage while the input voltage is being sampled and a power supply voltage while a reference voltage is being sampled, wherein each switch of the first plurality of switches further comprises:

a first transistor pair for selectively connecting the input voltage to a capacitor of the plurality of capacitors;

a second transistor pair for selectively connecting the bulk of one transistor of the first transistor pair to the input voltage;

a third transistor for connecting the bulk of the switch to the power supply voltage while an associated switch of the second plurality of switches is sampling the reference voltage; and a second plurality of switches in parallel with the first plurality of switches, one connected to each of the plurality of capacitors, for connecting a reference voltage to a second end of the capacitor, wherein a bulk of a switch of the second plurality of switches is connected to the reference voltage while the reference voltage is being sampled and a to power supply voltage while the input voltage is being sampled, wherein each switch of the second plurality of switches further comprises:

a fourth transistor pair for selectively connecting the reference voltage to a capacitor of the plurality of capacitors;

a fifth transistor pair for selectively connecting the bulk of one transistor of the first transistor pair to the reference voltage; and a sixth transistor for connecting the bulk of the switch to the power supply voltage while an associated switch of the first plurality of switches is sampling the input voltage.

18. The sampling network of claim 17, further including a third plurality of switches in parallel with the second plurality of switches, one connected to each of the plurality of capacitors, for connecting ground to a second end of the capacitor.

* * * * *